(12) United States Patent
Kamitani

(10) Patent No.: US 11,350,492 B2
(45) Date of Patent: May 31, 2022

(54) SAMPLE HOLDER

(71) Applicant: KYOCERA Corporation, Kyoto (JP)

(72) Inventor: Satoru Kamitani, Kirishima (JP)

(73) Assignee: KYOCERA CORPORATION, Kyoto (JP)

(*) Notice: Subject to any disclaimer, the term of this patent is extended or adjusted under 35 U.S.C. 154(b) by 399 days.

(21) Appl. No.: 16/470,598

(22) PCT Filed: Dec. 19, 2017

(86) PCT No.: PCT/JP2017/045520
§ 371 (c)(1),
(2) Date: Jun. 18, 2019

(87) PCT Pub. No.: WO2018/123729
PCT Pub. Date: Jul. 5, 2018

(65) Prior Publication Data
US 2019/0313482 A1  Oct. 10, 2019

(30) Foreign Application Priority Data
Dec. 26, 2016 (JP) .............................. JP2016-250752

(51) Int. Cl.
H05B 3/68 (2006.01)
H05B 3/14 (2006.01)
(Continued)

(52) U.S. Cl.
CPC ........... *H05B 3/143* (2013.01); *H01L 21/683* (2013.01); *H01L 21/68735* (2013.01); *H01L 21/68757* (2013.01); *H05B 3/74* (2013.01)

(58) Field of Classification Search
CPC ............. H01L 21/67103; H01L 21/683; H01L 21/68735; H01L 21/68757; H05B 3/143; H05B 3/265; H05B 3/74
(Continued)

(56) References Cited

U.S. PATENT DOCUMENTS

| 6,921,881 B2 * | 7/2005 | Ito ......................... C04B 35/581 |
| | | 219/145.22 |
| 2004/0188413 A1 * | 9/2004 | Natsuhara .............. H05B 3/143 |
| | | 219/444.1 |

(Continued)

FOREIGN PATENT DOCUMENTS

JP         2016-103560 A      6/2016

*Primary Examiner* — Sang Y Paik
(74) *Attorney, Agent, or Firm* — Volpe Koenig

(57) ABSTRACT

A sample holder includes: a ceramic substrate including one main surface serving as a sample holding surface; a heat-generating resistor located inside or on an other main surface of the ceramic substrate; a metal member having a first surface bonded to, by a bonding layer, and covering the other main surface of the ceramic substrate, the metal member including a through hole penetrating from the first surface to an opposite surface of the metal member; a lead terminal inserted into the metal member; and a conductive portion located inside the bonding layer, the conductive portion electrically connecting the heat-generating resistor and the lead terminal, the conductive portion including a region which extends in a same direction as the other main surface, and separate from the other main surface of the ceramic substrate.

9 Claims, 4 Drawing Sheets

(51) Int. Cl.
*H01L 21/687* (2006.01)
*H05B 3/74* (2006.01)
*H01L 21/683* (2006.01)

(58) Field of Classification Search
USPC .......................................... 219/443.1–468.2
See application file for complete search history.

(56) References Cited

U.S. PATENT DOCUMENTS

| | | | | |
|---|---|---|---|---|
| 2012/0299253 | A1* | 11/2012 | Kosakai | H01L 21/67103 |
| | | | | 279/128 |
| 2016/0196999 | A1* | 7/2016 | Yanoh | C04B 37/028 |
| | | | | 361/234 |

* cited by examiner

SAMPLE HOLDER

CROSS-REFERENCE TO RELATED APPLICATIONS

This application is a national stage entry according to 35 U.S.C. 371 of International Application No. PCT/JP2017/045520 filed on Dec. 19, 2017, which claims priority to Japanese Patent Application No. 2016-250752 filed on Dec. 26, 2016, the contents of which are entirely incorporated herein by reference.

TECHNICAL FIELD

The present disclosure relates to a sample holder.

BACKGROUND

As a sample holder used for a semiconductor manufacturing apparatus or the like, for example, a sample holder described in Japanese Unexamined Patent Publication JP-A 2016-103560 (hereinafter, referred to as Patent Literature 1) is known. The sample holder described in Patent Literature 1 includes a substrate including a sample holding surface at an upper surface of the substrate, a heat-generating resistor located on a lower surface of the substrate, and a support bonded to the lower surface of the substrate via a bonding layer. In recent years, the sample holder is required to further improve thermal uniformity of the sample holding surface.

SUMMARY

According to an aspect of the disclosure, a sample holder includes: a ceramic substrate including one main surface serving as a sample holding surface; a heat-generating resistor located inside or on an other main surface of the ceramic substrate; a metal member having a first surface bonded to, by a bonding layer, and covering the other main surface of the ceramic substrate, the metal member including a through hole penetrating from the first surface to an opposite surface of the metal member; a lead terminal inserted into the metal member; and a conductive portion located inside the bonding layer, the conductive portion electrically connecting the heat-generating resistor and the lead terminal, the conductive portion including a region which extends in a same direction as the other main surface, and separate from the other main surface of the ceramic substrate.

DETAILED DESCRIPTION

Figure 1:
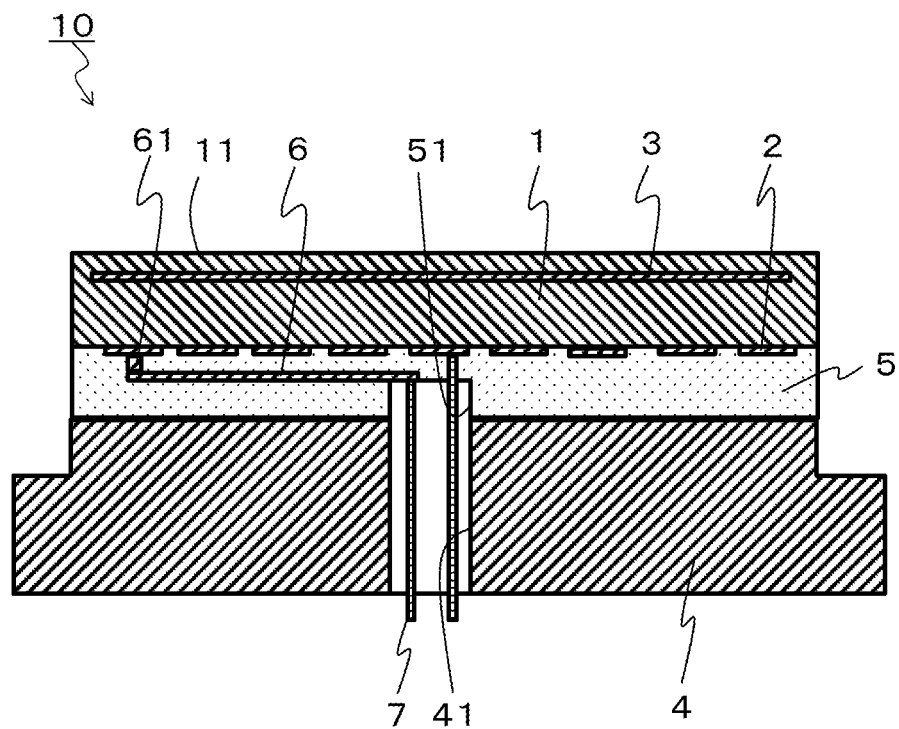
FIG. 1 is a sectional view showing an example of a sample holder.

FIG. 1 is a sectional view showing an example of a sample holder 10. As shown in FIG. 1, the sample holder 10 in the example includes a ceramic substrate 1 including one main surface serving as a sample holding surface 11, a metal member 4 which includes metal and covers the other main surface of the ceramic substrate 1 by an upper surface of the metal member 4, and a bonding layer 5 which bonds the other main surface of the ceramic substrate 1 and one main surface of the metal member 4. In addition, the sample holder 10 includes a heat-generating resistor 2 located inside or on the other main surface of the ceramic substrate 1, and a suction electrode 3 located on inside the ceramic substrate 1. In the following, for a description, "one main surface" may be referred to as an "upper surface", and "the other main surface" may be referred to as a "lower surface" in some cases, but this is an expression for helping understanding. These expressions are not intended to limit a method of using the sample holder 10.

The ceramic substrate 1 is a plate-like member including the sample holding surface 11 at an upper surface of the ceramic substrate 1. The ceramic substrate 1 holds a sample, such as a silicon wafer, on the sample holding surface 11 at the upper surface of the ceramic substrate 1. The sample holder 10 is a member having a circular shape when viewed in a plan view. The ceramic substrate 1 includes, for example, a ceramic material such as alumina, aluminum nitride, silicon nitride, or yttria. The heat-generating resistor 2 is located on a lower surface of the ceramic substrate 1. For dimensions of the ceramic substrate 1, for example, a diameter thereof can be set to be 200 to 500 mm and a thickness thereof can be set to be 2 to 15 mm.

Although various methods can be used as a method of holding a sample by using the ceramic substrate 1, the sample holder 10 of the example holds the sample by electrostatic force. Therefore, the sample holder 10 includes the suction electrode 3 inside the ceramic substrate 1. The suction electrode 3 is composed of two electrodes. One of the two electrodes is connected to a positive electrode of a power supply, and the other of the two electrodes is connected to a negative electrode. Each of the two electrodes is formed in a substantially semi-disc shape, and is disposed inside the ceramic substrate 1 such that the semicircular chords face each other. When the two electrodes are combined, an outline of the entire suction electrode 3 is circular. The center of the circular outline of the entire suction electrode 3 is set to be the same as the center of the outline of the ceramic substrate 1 which has the same circular shape. The suction electrode 3 includes, for example, a metal material such as platinum, tungsten, or molybdenum.

The heat-generating resistor 2 is a member for heating the sample held on the sample holding surface 11 at the upper surface of the ceramic substrate 1. The heat-generating resistor 2 can be located inside or on the lower surface of the ceramic substrate 1. In the sample holder 10 of the example, the heat-generating resistor 2 is located on the lower surface of the ceramic substrate 1. The heat-generating resistor 2 can be caused to generate heat by applying a voltage to the heat-generating resistor 2. The heat generated by the heat-generating resistor 2 is transmitted through an inside of the ceramic substrate 1 and reaches the sample holding surface 11 at the upper surface of the ceramic substrate 1. Accordingly, it is possible to heat the sample held on the sample holding surface 11.

The heat-generating resistor 2 is a linear pattern including a plurality of folded portions, and is located on substantially the entire lower surface of the ceramic substrate 1. Accordingly, it is possible to suppress occurrence of a variation in a heat distribution on the upper surface of the sample holder 10.

The heat-generating resistor 2 includes a conductor component and a glass component. Examples of the conductor component include a metal material such as silver palladium, platinum, aluminum, or gold. In order to suppress the glass component from foaming, a metal sinterable in an atmosphere may be selected as the metal material. In addition, examples of the glass component include an oxide of a material such as silicon, aluminum, bismuth, calcium, boron, and zinc. In addition, when the heat-generating resistor 2 is located inside the ceramic substrate 1, the conductor component may be tungsten, tungsten carbide, or the like.

The following method can be used to control a temperature of the sample holder 10. Specifically, the temperature can be measured by bringing a thermocouple into contact with the ceramic substrate 1. In addition, the temperature of the heat-generating resistor 2 can be measured by bringing the temperature measuring resistor into contact with the ceramic substrate 1 and measuring a resistance. When adjusting the voltage applied to the heat-generating resistor 2 based on the temperature of the heat-generating resistor 2, measured as described above, it is possible to control the heat generation of the heat-generating resistor 2 such that the temperature of the sample holder 10 becomes constant.

The metal member 4 is provided so as to support the ceramic substrate 1. The metal member 4 includes metal and covers the lower surface of the ceramic substrate 1 by the upper surface of the metal member 4. The lower surface of the ceramic substrate 1 and the upper surface of the metal member 4 are bonded by the bonding layer 5. The metal constituting the metal member 4 is not particularly limited. The term "metal" as used here also includes a composite material formed of metal, such as a composite material of ceramics and metal and a fiber reinforced metal. In general, when the sample holder 10 is used under an environment exposed to a halogen-based corrosive gas or the like, aluminum (Al), copper (Cu), stainless steel, and nickel (Ni), or an alloy of these metals may be used as the metal constituting the metal member 4. In addition, a structure of the metal member 4 is not particularly limited, and may include a cooling flow path for circulating a heat carrier such as gas or liquid. In this case, a liquid such as water or silicone oil or a gas such as helium (He) or nitrogen ($N_2$) can be used as the heat carrier.

The bonding layer 5 is provided so as to bond the ceramic substrate 1 and the metal member 4. The bonding layer 5 bonds the lower surface of the ceramic substrate 1 and the upper surface of the metal member 4. A thickness of the bonding layer 5 is set to be, for example, approximately 0.1 to 1 mm. As the bonding layer, for example, a resin material such as an epoxy resin can be used.

A conductive portion 6 and a lead terminal 7 are members for supplying power to the heat-generating resistor 2. One end of the conductive portion 6 is connected to the heat-generating resistor 2 and the other end of the conductive portion 6 is connected to the lead terminal 7. One end of the lead terminal 7 is connected to the conductive portion 6 and the other end of the lead terminal 7 is connected to an external power supply. As the conductive portion 6, for example, a metal material having electrical conductivity, such as copper can be used. As the lead terminal 7, for example, a metal material having electrical conductivity, such as nickel can be used.

More specifically, the metal member 4 includes a through hole 41 penetrating from the upper surface to lower surface of the metal member 4. The bonding layer 5 includes a recess portion 51 on a lower surface of the bonding layer 5. The through hole 41 of the metal member 4 and the recess portion 51 of the bonding layer 5 are connected such that inner circumferential surfaces thereof are continuous. The conductive portion 6 is located inside the bonding layer 5 and includes a portion extending along the lower surface of the ceramic substrate 1. As the portion of the conductive portion 6 extending along the lower surface of the ceramic substrate 1, for example, a metal plate can be used. In addition, in the example, the conductive portion 6 and heat-generating resistor 2 are connected to each other by a via hole conductor 61. As the via hole conductor, for example, a conductive material such as solder or a brazing material can be used.

In the example, the entire conductive portion 6 extends along the lower surface of the ceramic substrate 1, but the disclosure is not limited to such a configuration. For example, the conductive portion 6 may include both the portion extending along the lower surface of the ceramic substrate 1 and a portion extending in a vertical direction. In such a case, the heat-generating resistor 2 and the conductive portion 6 may be directly connected to each other without the via hole conductor 61. Here, the vertical direction means a direction perpendicular to the upper surface of the ceramic substrate 1.

Figure 2:
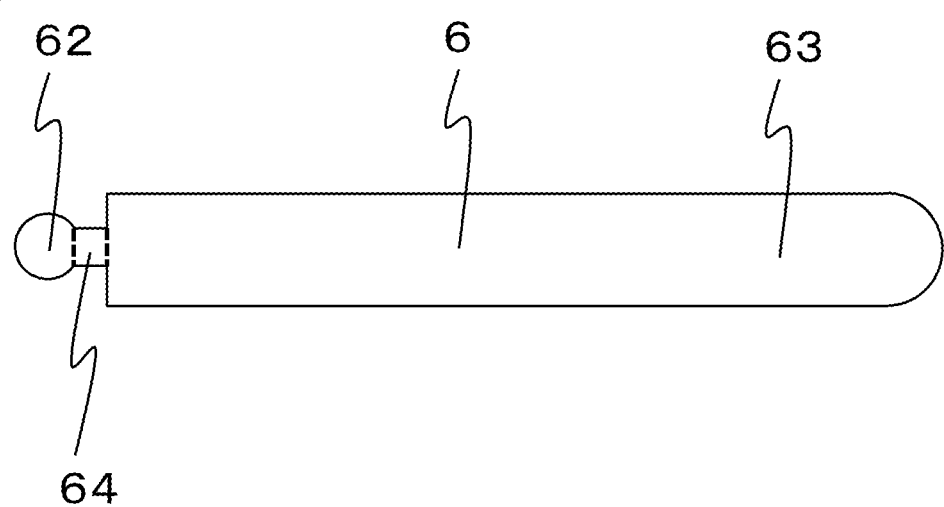
FIG. 2 is a view of a conductive portion in the example of the sample holder, viewed from below.

As shown in FIG. 2, the conductive portion 6 may have a band shape, for example, when a surface extending along the lower surface of the ceramic substrate 1 is viewed. More specifically, the conductive portion 6 may be almost in the band shape and may include a first region 62 connected to the via hole conductor 61 and a second region 63 connected to the lead terminal 7. Then, a third region 64 thinner than the first region 62 and the second region 63 may be provided between the first region 62 and the second region 63. When the conductive portion 6 includes the third region 64, it is possible to reduce a concern that, at the time of connecting the first region 62 and the heat-generating resistor 2 by the via hole conductor 61 such as solder, the via hole conductor 61 before hardening spreads to the second region 63. Accordingly, connection reliability between the conductive portion 6 and the heat-generating resistor 2 can be improved.

The conductive portion 6 connects the via hole conductor 61 and the lead terminal 7. The portion of the conductive portion 6 extending along the lower surface of the ceramic substrate 1 is exposed at a bottom of the recess portion 51. In other words, the other end of the conductive portion 6 is exposed at the bottom of the recess portion 51.

The lead terminal 7 is inserted into the through hole 41 of the metal member 4 from a lower surface side of the metal member 4 and reaches the bottom of the recess portion 51. In order to ensure insulation from the metal member 4, the lead terminal 7 is located apart from the metal member 4 so as not to be brought into contact with the metal member 4. The lead terminal 7 is connected to the conductive portion 6 at the bottom of the recess portion 51. For the connection between the lead terminal 7 and the conductive portion 6, for example, a bonding material having electrical conductivity can be used. As the bonding material, for example, a brazing material or solder can be used.

The sample holder 10 of the example includes the ceramic substrate 1 including one main surface serving as the sample holding surface 11; the heat-generating resistor 2 located inside or on the other main surface of the ceramic substrate 1; the metal member 4 located via a bonding layer 5 so as to cover the other main surface of the ceramic substrate 1, the metal member 4 being provided with the through hole 41 penetrating from the one main surface to the other main surface; the lead terminal 7 inserted into the metal member 4; and the conductive portion 6 located inside the bonding layer 5, the conductive portion 6 electrically connecting the heat-generating resistor 2 and the lead terminal 7, the conductive portion 6 including a region which extends in a same direction as the other main surface, and separate from the other main surface of the ceramic substrate 1. When the conductive portion 6 includes the region which extends in a same direction as the other main surface, and separate from the other main surface of the ceramic substrate 1, it is possible to make the heat generated in conductive portion 6 difficult to be transmitted to the ceramic substrate 1. Accordingly, thermal uniformity in the sample holding surface 11 can be improved.

In addition, the conductive portion 6 may be configured to be covered entirely with the bonding layer 5. Accordingly, since the conductive portion 6 can be insulated from the outside, the reliability of the sample holder 10 can be improved. Here, the expression that "the conductive portion 6 is covered entirely with the bonding layer 5" does not have to mean that the conductive portion 6 is covered entirely with the bonding layer 5 in a strict sense. Specifically, in a connection portion between the conductive portion 6 and the heat-generating resistor 2, a connection portion between the conductive portion 6 and the lead terminal 7, and other parts requiring electrical connection, there may be a portion which is not covered with the bonding layer 5 in order to perform the electrical connection.

In addition, a thermal conductivity of the bonding layer 5 may be smaller than a thermal conductivity of the ceramic substrate 1. Accordingly, it is possible to reduce the transmission of the heat generated in the conductive portion 6 to the ceramic substrate 1 through the bonding layer 5. As a result, the thermal uniformity in the sample holding surface 11 can be improved.

Figure 3:
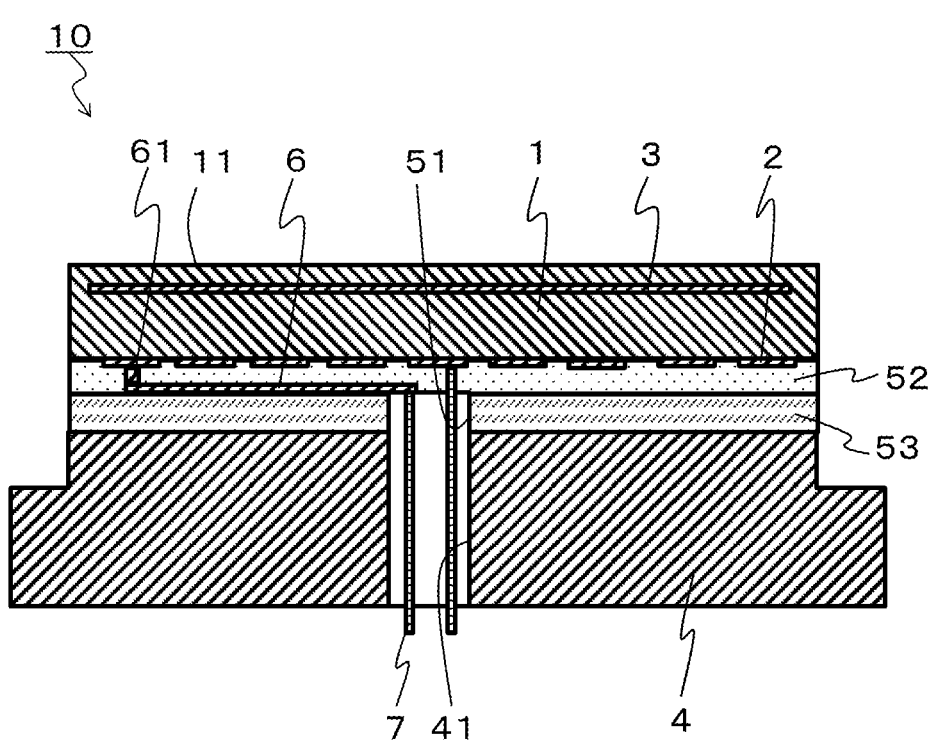
FIG. 3 is a sectional view showing another example of the sample holder.

In addition, as shown in FIG. 3, the heat-generating resistor 2 may be located on the lower surface of the ceramic substrate 1, the bonding layer 5 may have a lamination structure including a first layer 52 bonded to the ceramic substrate 1 and the second layer 53 bonded to the metal member 4, and an elastic modulus of the first layer 52 may be larger than an elastic modulus of the second layer 53. Accordingly, since the ceramic substrate 1 and the heat-generating resistor 2 can be firmly restrained by covering the heat-generating resistor 2 with the first layer 52 having a large elastic modulus, it is possible to reduce a possibility that the heat-generating resistor 2 may be peeled off under a heat cycle. In addition, when bonding the metal member 4 with the second layer 53 having a small elastic modulus, it is possible to reduce a thermal stress generated between the metal member 4 having a large thermal expansion and the bonding layer 5. As the first layer 52, for example, an epoxy resin can be used. As the second layer 53, for example, a silicone resin can be used.

In addition, the conductive portion 6 may be located between the first layer 52 and the second layer 53. When the conductive portion 6 is located between the first layer 52 and the second layer 53, compared to a case where the conductive portion 6 is located inside the first layer 52, or the conductive portion 6 is located inside the second layer 53, an area of an interface inside the bonding layer 5 can be reduced. Therefore, when the temperature of the sample holding surface 11 is lowered, the heat remaining in the ceramic substrate 1 can be quickly dissipated to the metal member 4. Therefore, the temperature lowering rate of the sample holder 10 can be improved.

Figure 4:
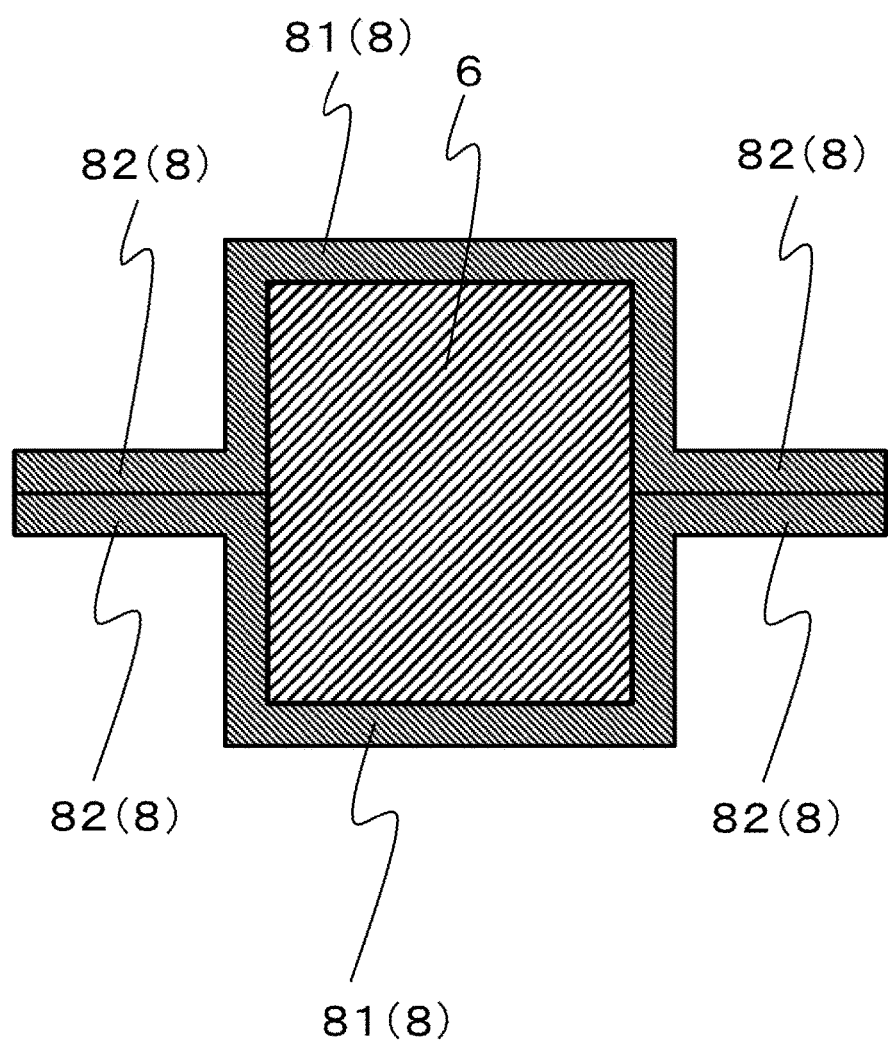
FIG. 4 is a sectional view showing a conductive portion and a film-like member in another example of the sample holder.

In addition, as shown in FIG. 4, at least apart of the conductive portion 6 may be covered with a film-like member 8 having a thermal conductivity smaller than the thermal conductivity of the bonding layer 5. Accordingly, it is possible to reduce a concern of the transmission of the heat generated in the conductive portion 6 to the ceramic substrate 1 through the bonding layer 5. As the film-like member 8, for example, a polyimide film can be used.

The film-like member 8 can be attached to the bonding layer 5 in a winding manner. In addition, the film-like member 8 may be formed of a plurality of members. Specifically, the film-like member 8 is formed of two members each including a recess-like portion 81 and a flange portion 82 extending on both sides of the recess-like portion 81, and the conductive portion 6 may be covered with the recess-like portions 81 of the two members. In this case, since the two members can be firmly fixed by fixing the flange portions 82 to each other, it is possible to reduce a concern that the film-like member 8 may be peeled off from the conductive portion 6.

Figure 5:
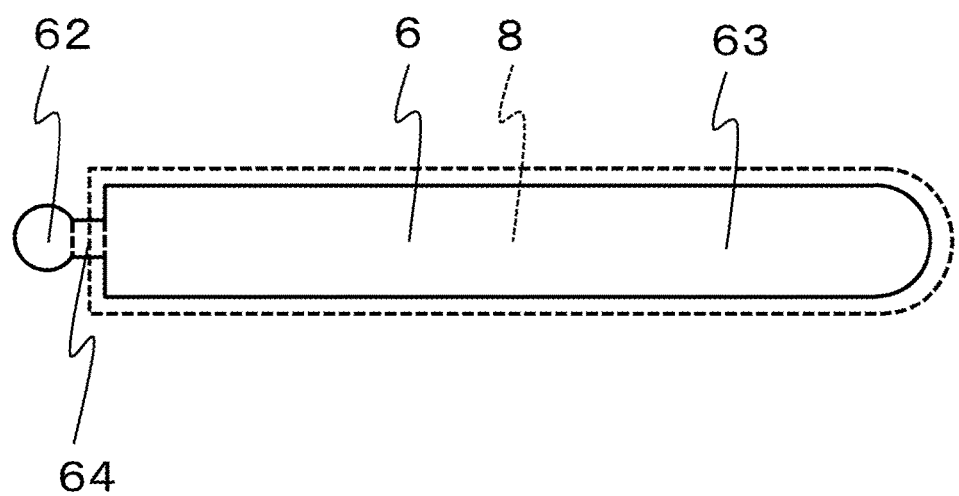
FIG. 5 is a view of the conductive portion and the film-like member in still another example of the sample holder, viewed from above.
Figure 6:
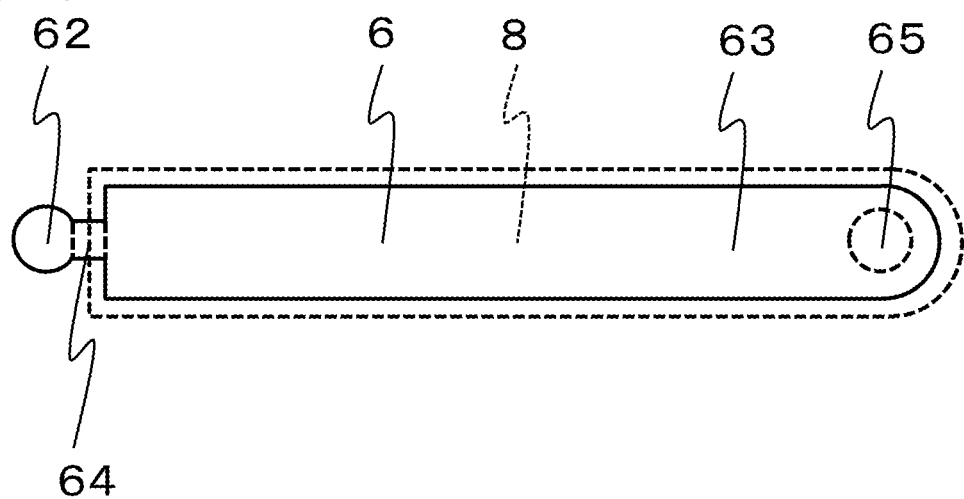
FIG. 6 is a view of the conductive portion and the film-like member in still another example of the sample holder, viewed from below.

More specifically, for example, as shown in FIGS. 5 and 6, the conductive portion 6 has the first region 62, the second region 63, and the third region 64, and a lower surface of the second region 63 may include a connection region 65 connected to the lead terminal 7. In this case, portions of the second region 63 other than the connection region 65 may be covered with the film-like member 8. In FIGS. 5 and 6, in order to clarify a positional relationship between the film-like member 8 and the conductive portion 6, the film-like member 8 is shown transparently. When the portions of the second region 63 other than the connection region 65 are covered with the film-like member 8, it is possible to reduce a concern that, at the time of connecting the first region 62 and the heat-generating resistor 2 by the via hole conductor 61 such as solder, the via hole conductor 61 before hardening spreads to the second region 63. Accordingly, connection reliability between the conductive portion 6 and the heat-generating resistor 2 can be improved.

Figure 7:
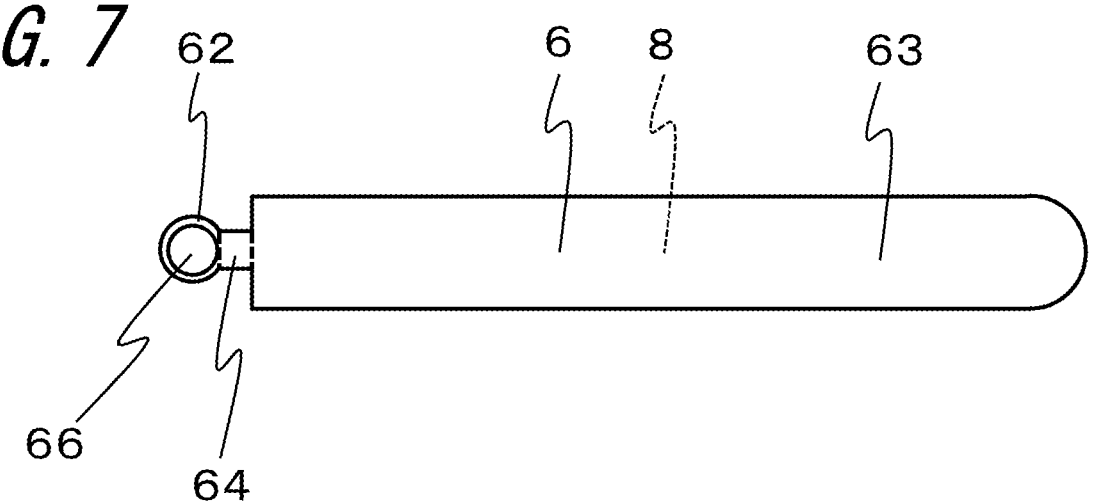
FIG. 7 is a view of a conductive portion instill another example of the sample holder viewed from below.

In addition, as shown in FIG. 7, a low thermal conductivity member 66 may be located on a lower surface of the first region 62. As the low thermal conductivity member 66, a member having a thermal conductivity smaller than the thermal conductivity of the bonding layer 5 is used. As the member having a thermal conductivity smaller than the thermal conductivity of the bonding layer 5, for example, polyimide or the like can be used. Accordingly, it is possible to reduce a concern that the heat generated in the heat-generating resistor 2 is transmitted through the via hole conductor 61 and the first region 62 to the bonding layer 5. As a result, the thermal uniformity of the sample holding surface 11 can be improved. In FIG. 7, a part of the lower surface of the first region 62 is covered with the low thermal conductivity member 66, but the disclosure is not limited to such a configuration. For example, the lower surface of the first region 62 may be covered entirely with the low thermal conductivity member 66. Accordingly, it is possible to further reduce a concern that the heat generated in the heat-generating resistor 2 is transmitted through the via hole conductor 61 and the first region 62 to the bonding layer 5.

In addition, the entire lower surface and a part of a side surface of the first region 62 may be covered with the low thermal conductivity member 66. Accordingly, it is possible to further reduce a concern that the heat generated in the heat-generating resistor 2 is transmitted through the via hole conductor 61 and the first region 62 to the bonding layer 5.

REFERENCE SIGNS LIST

1: Ceramic substrate
2: Heat-generating resistor
3: Suction electrode
4: Metal member
41: Through hole
5: Bonding layer
51: Recess portion
6: Conductive portion
7: Lead terminal
8: Film-like member
81: Recess-like portion
82: Flange portion
10: Sample holder
11: Sample holding surface

The invention claimed is:

1. A sample holder, comprising:
a ceramic substrate comprising one main surface serving as a sample holding surface;
a heat-generating resistor located inside or on an other main surface of the ceramic substrate;
a metal member having a first surface bonded to, by a bonding layer, and covering the other main surface of the ceramic substrate, the metal member comprising a through hole penetrating from the first surface to an opposite surface of the metal member;
a lead terminal inserted into the metal member; and
a conductive portion located inside the bonding layer, the conductive portion electrically connecting the heat-generating resistor and the lead terminal, the conductive portion comprising a region which extends in a same direction as the other main surface, and separate from the other main surface of the ceramic substrate,
wherein at least a part of the conductive portion is covered with a film-like member having a thermal conductivity smaller than the thermal conductivity of the bonding layer.

2. The sample holder according to claim 1, wherein the conductive portion is covered entirely with the bonding layer.

3. The sample holder according to claim 1, wherein a thermal conductivity of the bonding layer is smaller than a thermal conductivity of the ceramic substrate.

4. The sample holder according to claim 1, wherein
the heat-generating resistor is located on the other main surface of the ceramic substrate, and
the bonding layer has a laminate structure comprising a first layer bonded to the ceramic substrate and a second layer bonded to the metal member, and an elastic modulus of the first layer is larger than an elastic modulus of the second layer.

5. The sample holder according to claim 4, wherein the conductive portion is located between the first layer and the second layer.

6. A sample holder, comprising:
a ceramic substrate comprising a sample holding surface and a second surface opposite to the sample holding surface;
a heat-generating resistor located on the second surface of the ceramic substrate;
a bonding layer bonding the second surface of the ceramic substrate to a first surface of a metal member, wherein a thermal conductivity of the bonding layer is less than a thermal conductivity of the ceramic substrate;
the metal member comprising the first surface and an opposite surface, and a through hole penetrating from the first surface to the opposite surface of the metal member;
a lead terminal inserted into the through hole of the metal member; and
a conductive portion located inside of the bonding layer, the conductive portion comprising a lengthwise region which extends substantially parallel to, and is separated from, the second surface of the ceramic substrate, the conductive portion electrically connecting the heat-generating resistor to the lead terminal, and
wherein at least a part of the conductive portion is covered with a film-like member having a thermal conductivity smaller than the thermal conductivity of the bonding layer.

7. The sample holder of claim 6, wherein the bonding layer comprises a first layer laminated to a second layer, wherein the first layer is bonded to the ceramic substrate and the second layer is bonded to the metal member, and an elastic modulus of the first layer is greater than an elastic modulus of the second layer.

8. The sample holder of claim 7, wherein the lengthwise region of the conductive portion is located between the first layer and the second layer.

9. The sample holder of claim 6, wherein the film-like member comprises two members fixed to each other, each of the two members comprising a recess-like portion surrounding the conductive portion, and a flange portion extending on both sides of the recess-like portion.

* * * * *